US009733328B2

(12) United States Patent
Doneva et al.

(10) Patent No.: US 9,733,328 B2
(45) Date of Patent: Aug. 15, 2017

(54) COMPRESSED SENSING MR IMAGE RECONSTRUCTION USING CONSTRAINT FROM PRIOR ACQUISITION

(75) Inventors: Mariya Ivanova Doneva, Hamburg (DE); Stefanie Remmele, Hamburg (DE); Peter Börnert, Hamburg (DE); Peter Mazurkewitz, Hamburg (DE); Julien Senegas, Hamburge (DE); Jochen Keupp, Rosengarten (DE); Kay Nehrke, Ammersbek (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 895 days.

(21) Appl. No.: 14/006,244

(22) PCT Filed: Feb. 28, 2012

(86) PCT No.: PCT/IB2012/050930
§ 371 (c)(1),
(2), (4) Date: Sep. 19, 2013

(87) PCT Pub. No.: WO2012/127341
PCT Pub. Date: Sep. 27, 2012

(65) Prior Publication Data
US 2014/0009156 A1    Jan. 9, 2014

(30) Foreign Application Priority Data
Mar. 24, 2011   (EP) .................................... 11159494

(51) Int. Cl.
*G01R 33/56*    (2006.01)
*G01R 33/561*   (2006.01)
(Continued)

(52) U.S. Cl.
CPC .......... *G01R 33/56* (2013.01); *G01R 33/5611* (2013.01); *G01R 33/4824* (2013.01); *G01R 33/5608* (2013.01); *G01R 33/56509* (2013.01)

(58) Field of Classification Search
CPC ................ G01R 33/56; G01R 33/5611; G01R 33/4824; G01R 33/5608; G01R 33/56509
See application file for complete search history.

(56) References Cited

U.S. PATENT DOCUMENTS 5,522,390 A    6/1996 Tuithof et al.
5,697,370 A    12/1997 Pelc
(Continued)

OTHER PUBLICATIONS

Wu, Bing et al "Prior Estimate-based Compressed Sensing in parallel MRI" Magnetic Resonance in Medicine, vol. 65, No. 1, 2010, pp. 83-95.
(Continued)

*Primary Examiner* — Rodney Bonnette

(57) ABSTRACT

The invention relates to a method of MR imaging of at least a portion of a body (10) of a patient placed in an examination volume of a MR device (1), the method comprising the steps of: —subjecting the portion of the body (10) to a first imaging sequence for acquiring a first signal data set (21); —subjecting the portion of the body (10) to a second imaging sequence for acquiring a second signal data set (23), wherein the imaging parameters of the second imaging sequence differ from the imaging parameters of the first imaging sequence; —reconstructing a MR image from the second signal data set (23) by means of regularization using the first signal data set (21) as prior information. Moreover, the invention relates to a MR device (1) and to a computer program for a MR device (1).

10 Claims, 2 Drawing Sheets

(51) Int. Cl.
*G01R 33/48* (2006.01)
*G01R 33/565* (2006.01)

(56) References Cited

U.S. PATENT DOCUMENTS

| | | | |
|---|---|---|---|
| 6,552,540 B2 | 4/2003 | Fuderer | |
| 7,154,268 B2 | 12/2006 | Kellman | |
| 7,403,005 B2 | 7/2008 | Katscher | |
| 7,592,808 B1 | 9/2009 | King | |
| 7,592,809 B1 | 9/2009 | King | |
| 7,688,068 B2 | 3/2010 | Beatty | |
| 7,746,070 B2 | 6/2010 | Park | |
| 2008/0298661 A1 | 12/2008 | Huang | |
| 2009/0161932 A1 | 6/2009 | Chen | |
| 2010/0290683 A1 | 11/2010 | Demeester et al. | |
| 2011/0105884 A1 | 5/2011 | Beck | |
| 2012/0169338 A1* | 7/2012 | King | G01R 33/5611 324/309 |
| 2013/0089271 A1* | 4/2013 | Boernert | G01N 24/08 382/274 |
| 2013/0207652 A1* | 8/2013 | Weller | G01R 33/5611 324/309 |
| 2013/0310678 A1* | 11/2013 | Balbi | A61B 5/055 600/410 |
| 2014/0091793 A1* | 4/2014 | Guo | G01R 33/5611 324/309 |
| 2015/0077112 A1* | 3/2015 | Otazo | A61B 5/055 324/318 |

OTHER PUBLICATIONS

Eslami, Ramin et al "Robust Reconstruction of MRSI Data using a Sparse Spectral Model and High Resolution MRI Priors", IEEE Transactions on Medical Imaging, vol. 29, No. 6, Jun. 2010, pp. 1297-1309.

Otazo, R. et al "Adaptive Compressed Sensing MRI", Proceedings of the International Society for Magnetic Resonance in Medicine, Apr. 2010, pp. 4867.

Samsonov, A. et al "MRI Compressed sensing via Sparsifying Images", Proceedings of the International Society for Magnetic Resonance in Medicine, 2007, pp. 342.

Lustig, M. et al "Sparse MRI: The Application of Comparessed Sensing for Rapid MR Imaging", Magnetic Resonance in Medicine. vol. 58, No. 6, 2007, pp. 1182-1195.

Velikina, J.V. et al "PYRO-LO: A Hybrid Technique for CE MRS with Extreme Data Undersampling Factors", Proceedings of the International Society for Magnetic Resonance in Medicine, vol. 17, 2009, pp. 277.

Liang, Dong et al "Accelerating SENSE using Compressed Sensing", Magnetic Resonance in Medicine, vol. 62, 2009, pp. 1574-1584.

Liu, Bo et al "SPARSESENSE: Application of Compressed Sensing in Parallel MRI", Proceedings of the 5th International Conference on Information and Technology and Application in Biomedicine, 2008, pp. 127-130.

Tsao et al "K-T Blast and K-T Sense Dynamic MRI With High Frame Rate Exploiting Spatiotemporal Correlatons" Magnetic Res. in Med. 50 p. 1031-1042 (2003).

Jung et al "Improved K-T Blast and K-T Sense Using Focuss" Physics in Med. and Biol. 52 (2007) p. 3201-3226.

Pedersen et al "K-T PCA: Temporally Constrained K-T Blast Reconstruction Using Principal Component Analysis" Magnetic Reson. in Med. vol. 62 p. 706-716 (2009).

Lustig et al "Sparse MRI: The Application of Compressed Sensing for Rapid MR Imaging" Magnetic Res. in Med. 58 p. 1182-1195 (2007).

Gamper et al "Compressed Sensing in Dynamic MRI" Magnetic Res. in Med. 59 p. 365-373 (2003).

Mistretta et al "Highly Constrained Backprojection for Time-Resoloved MRI" Magnetic Resonance in Med. vol. 55, p. 30-40 (2006).

Knoll et al "Tailored 3D Random Sampling Patterns for Non-Lineary Parallel Imaging" Proc. Intl. Soc. Mag. Resone Med. 18 (2010) p. 2876.

* cited by examiner

COMPRESSED SENSING MR IMAGE RECONSTRUCTION USING CONSTRAINT FROM PRIOR ACQUISITION

CROSS-REFERENCE TO PRIOR APPLICATIONS

This application is the U.S. National Phase application under 35 U.S.C. §371 of International Application No. PCT/IB2012/050930, filed on Feb. 28, 2012, which claims the benefit of European Patent Application No. 11159494.1, filed on Mar. 24, 2011. These applications are hereby incorporated by reference herein.

TECHNICAL FIELD

The invention relates to the field of magnetic resonance (MR) imaging. It concerns a method of MR imaging of at least a portion of a body of a patient placed in an examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field of the RF pulse extends perpendicular to the z-axis, so that the magnetization performs a precession about the z-axis. This motion of the magnetization describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°). The RF pulse is radiated toward the body of the patient via a RF coil arrangement of the MR device. The RF coil arrangement typically surrounds the examination volume in which the body of the patient is placed.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF antennas or coils which are arranged and oriented within the examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving RF antennas or coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or by other per se known reconstruction techniques.

Imaging speed is important in many MR imaging applications. However, the speed at which the MR signal data required for reconstruction of a MR image can be collected is fundamentally limited by physical and physiological constraints. Hence, many recent developments in the MR imaging field aim at reducing the amount of acquired signal data without degrading the quality of the reconstructed MR image. Among many of such developments the theory of compressed sensing (CS) has great potential for significant signal data reduction. In CS theory, a signal data set which has a sparse representation in a transform domain can be recovered from undersampled measurements by application of a suitable regularization algorithm. The possibility of undersampling leads to a significantly reduced acquisition time. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction. In most existing CS-based MR acquisition and reconstruction schemes the basic CS formulation is used which exploits only the prerequisite that the MR signal data is sparse in a transform domain. For example, M. Lustig et al. have proposed the application of CS for rapid MR imaging (M. Lustig et al.: "Sparse MRI: The Application of Compressed Sensing for Rapid MR Imaging", Magnetic Resonance in Medicine, 58, 1182-1195, 2007). It is also known that, since additional prior information about the unknown MR image may be available in certain applications, it is advantageous to incorporate this prior information into the CS reconstruction.

As already mentioned above, scan time is a critical factor in MR imaging. For this reason, the temporal or spatial resolution of the acquired MR images as well as the number of scans within a clinical examination is often limited. Due to time limitations in clinical practice, MR imaging scans requiring a particularly long scan time are sometimes even completely excluded from the protocol or the signal data has to be acquired at low resolution. The above mentioned CS technique has successfully helped to reduce the scan time required for reconstruction of a single MR image. However, the time required for a complete MR examination which includes the acquisition and reconstruction of several MR images of different contrast types for obtaining the desired diagnostic information, still exceeds the time limits in many practical cases.

SUMMARY OF THE INVENTION

From the foregoing it is readily appreciated that there is a need for an improved MR imaging technique. It is consequently an object of the invention to enable MR imaging at a further reduced acquisition time.

In accordance with the invention, a method of MR imaging of at least a portion of a body of a patient placed in an examination volume of a MR device is disclosed. The method comprises the steps of:
- subjecting the portion of the body to a first imaging sequence for acquiring a first signal data set;
- subjecting the portion of the body to a second imaging sequence for acquiring a second signal data set, wherein the imaging parameters of the second imaging sequence differ from the imaging parameters of the first imaging sequence;
- reconstructing a MR image from the second signal data set by means of regularization using the first signal data set as prior information.

As mentioned above, many clinical MR examinations include several different scans within a protocol yielding MR images of the same anatomy. For instance, a typical brain MR imaging session may include $T_1$- and $T_2$-weighted spin echo imaging sequences, fluid-attenuated inversion-recovery (FLAIR) sequences and sometimes additional $T_2^*$-weighted gradient echo perfusion scans. In some cases, diffusion measurements and contrast enhanced $T_1$-weighted gradient echo or spin echo imaging sequences may be applied additionally during the same examination in order to obtain sufficient diagnostic information. All these scans yield different tissue contrasts, but since they share the same underlying anatomy of the examined patient there are strong correlations between the different signal data sets. This data redundancy is exploited in accordance with the invention during the image acquisition and reconstruction in order to improve the time efficiency, the MR image quality and, finally, the diagnostic value.

The first and second imaging sequences refer to different scans of a protocol of a clinical MR examination within the meaning of the invention. Differing imaging parameters of the first and second imaging sequences may thus imply, for example, that the first and second signal data sets are of different contrast types. However, the first and second signal data sets could also be of the same contrast type, but of different spatial (or temporal) resolutions.

It is the gist of the invention to exploit the mutual information contained in the first and second signal data sets, which are acquired by means of the first and second imaging sequences. This mutual information is made use of in the step of reconstructing the MR image by means of regularization, wherein the first signal data set is used as prior information. In this way, an appreciable scan acceleration can be achieved, namely by acquiring the first and/or second signal data sets in an (strongly) undersampled fashion. Moreover, image quality can be improved by incorporating the first signal data set as prior information into the image reconstruction process. Further, higher resolution scans are enabled by the invention without increasing the scan time beyond practical limits.

In a preferred embodiment of the invention, the MR image is reconstructed by means of the above mentioned compressed sensing technique. CS is able to provide an accurate reconstruction of the MR image from only a small subset of k-space rather than the entire k-space grid. The first signal data set can be used as a "prior image" to constrain the iterative CS reconstruction process. For example, the compressed sensing reconstruction can be constrained by a support in the sparse transform domain which is derived from the first signal data set. This enables a particularly significant reduction of the scan time. The correct identification of the support in the appropriate sparse domain of the CS scheme enables the reduction of the necessary signal data by as much as a factor of 2 or 3.

According to another preferred embodiment of the invention, non-Cartesian sampling of k-space is applied during acquisition of the first and/or second signal data sets.

The CS approach requires that aliasing artifacts due to k-space undersampling are incoherent. This incoherence can be obtained, for example, by non-Cartesian (for example radial) sampling of k-space. On the other hand, reconstruction of non-Cartesian data is generally often ill-conditioned, so the approach of the invention can be used to improve the conditioning of the reconstruction problem by means of regularization, even without using CS.

According to yet another preferred embodiment of the invention, the first and/or second signal data sets are acquired by means of parallel imaging via two or more RF receiving antennas, wherein the MR image is reconstructed by taking the spatial sensitivity profiles of the RF receiving antennas into account. This corresponds to the well-known SENSE or SMASH techniques, wherein the method of the invention allows to apply a reduction factor which is significantly higher than the reduction factor typically achievable with conventional parallel imaging techniques. Hence, the imaging speed can be significantly increased by the invention in comparison to conventional approaches.

It is possible to apply the method of the invention in such a manner that the first signal data set constitutes a reference data set. The reference data set can be acquired, for example, by means of a high resolution anatomic scan, fully sampled or adequately combined from undersampled data, or as a combination from the signal data of several different scans. For example, a variable density k-space sampling pattern of the second imaging sequence can be determined from the reference data set. This means that the parameters of an appropriate CS setting can be derived from the reference data set. Alternatively, background image regions containing no image intensity can be determined from the reference data set. This information can be used to exclude the background image regions in the reconstruction of the MR image. The determined background image regions constitute the prior information within the meaning of the invention in this embodiment. Restricting the reconstruction by means of regularization to the image regions outside the background image regions enables to improve the quality of the reconstructed image and to further accelerate the image acquisition by undersampling of k-space.

The method of the invention may further comprise image registration and/or motion correction of the first and second signal data sets before reconstruction of the MR image (or MR images). The first signal data set may, for example, be a high-resolution data set obtained in a previous MR imaging session. In this case, image registration or motion compensation may be necessary before reconstruction of the desired MR image in order to ensure data consistency of the first and second signal data sets. Alternatively, the acquisition of the first and second signal data sets can be performed as one continuous scan without any pauses. In this way, motion between the individual scans can be reduced. However, it has to be mentioned that due to the acceleration which is achievable by CS in accordance with the invention, the sensitivity to motion between the successive individual acquisition steps is per se reduced. As a result, the consistency of the first and second signal data sets is improved.

According to a further aspect of the invention, two or more imaging sequences are used for acquiring two or more signal data sets, wherein the imaging parameters of the two or more imaging sequence are different. Two (or more) MR images are then reconstructed, wherein the signal data of at least one MR image is used as prior information for reconstruction of the other MR image (or MR images). This enables, for example, to acquire all signal data sets of a protocol in an undersampled fashion in order to increase imaging speed. Two or more MR images can be reconstructed from this data by means of regularization, wherein the MR images have different contrast types or resolutions according to the different imaging parameters. The quality of all MR images is preserved by exploiting the inter-scan correlations of the different signal data sets acquired from the same object.

Moreover, an inter-scan keyhole technique can be implemented according to the afore-described aspect of the invention, in which (at least a part of) k-space data of one signal data set is used as prior information for reconstruction of a MR image from the other signal data set. In case the signal data sets are of different contrast types, mixed contrast images may result after reconstruction from the shared signal data.

According to the invention, the scope of CS reconstruction from a single signal data set is extended to use several different signal data sets acquired within a protocol as mutual prior information during reconstruction. The above described inter-scan keyhole approach as well as reconstruction by regularization from non-Cartesian scans are comprised in the concept of using mutual information of the different signal data sets within a protocol.

There are many different reconstruction methods that fit into the concept of the invention. In SENSE reconstruction, for example, the low resolution image, which is acquired as SENSE reference scan, can be used as prior information in regularized SENSE reconstruction.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit. The method of the invention is preferably implemented by a corresponding programming of the reconstruction unit, the visualization unit, and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENT

Figure 1:
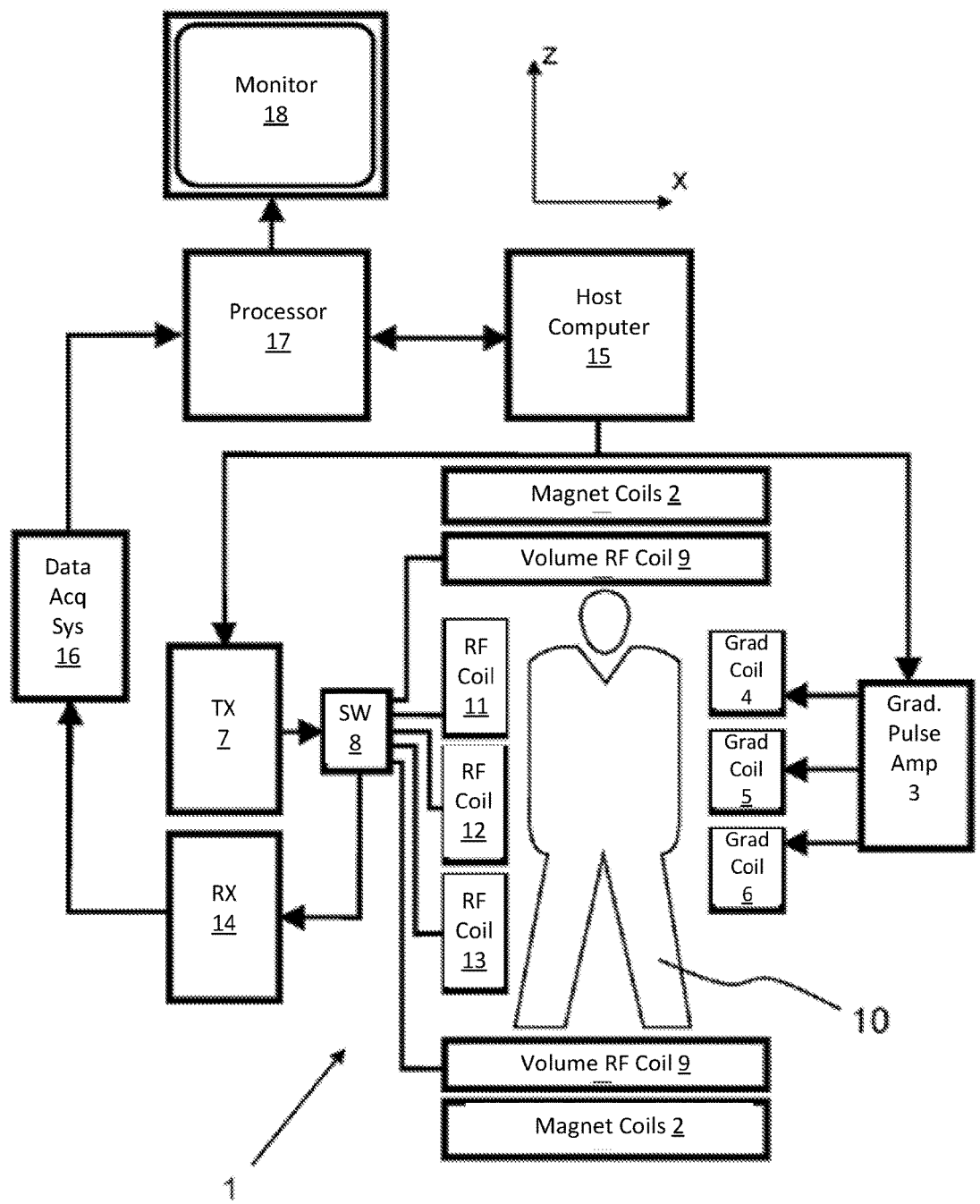
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used for parallel imaging to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
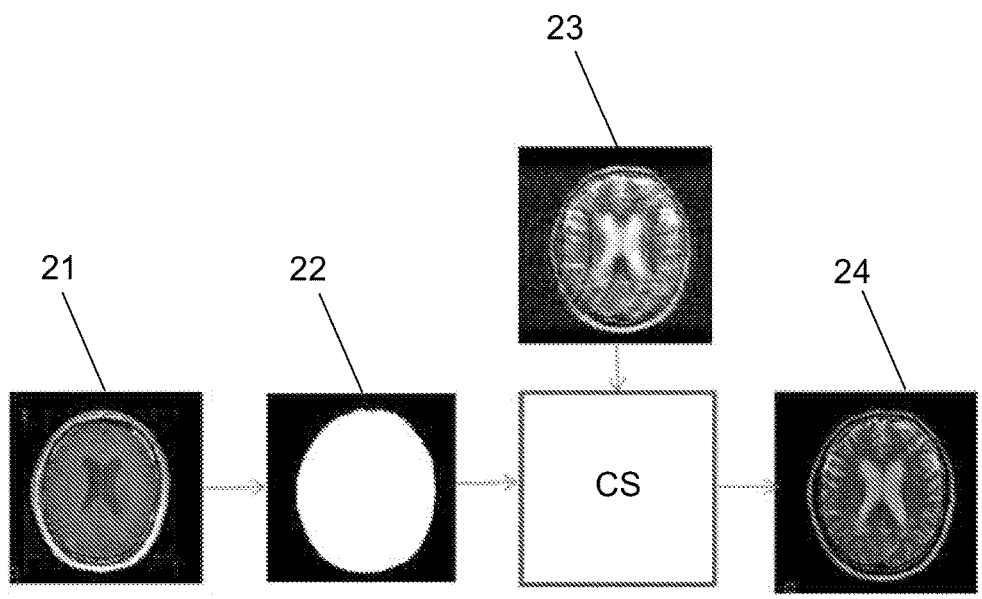
FIG. 2 illustrates the image acquisition and reconstruction scheme of a first embodiment of the invention.
Figure 3:
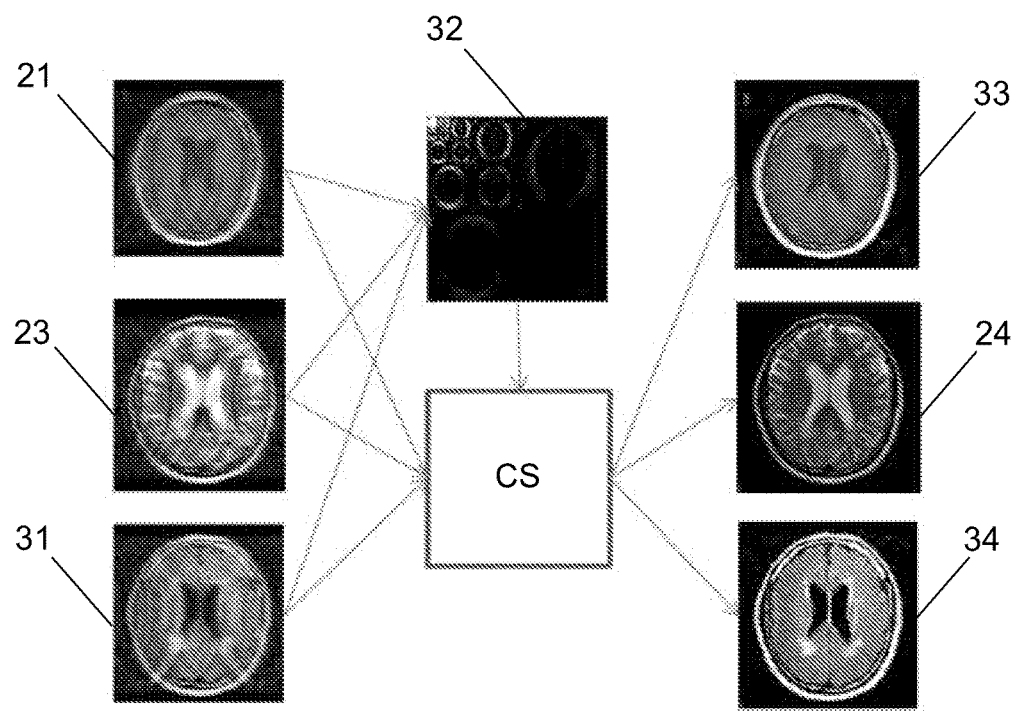
FIG. 3 illustrates the image acquisition and reconstruction scheme of a second embodiment of the invention.

With continuing reference to FIG. 1 and with further reference to FIGS. 2 and 3, different embodiments of the imaging approach of the invention are explained.

A first embodiment of the invention is illustrated in the block diagram in FIG. 2. A first imaging sequence is applied to the body 10 for acquiring a first signal data set 21. The first imaging sequence may be, for example, a $T_1$-weighted spin-echo sequence. The first signal data set 21 corresponds to a fully sampled high-resolution MR image. The first signal data set 21 is to be used as a reference data set as prior information in a CS setting in accordance with the invention. The first signal data set 21 is used to determine acquisition parameters such as the k-space sampling density as well as an upper limit for the acceleration factor in CS. The signal distribution in k-space is primarily determined by the geometry and not by the contrast. Therefore, the first signal data set 21 can be used to estimate the k-space distribution which allows to determine an adaptive variable density k-space sampling pattern for the following signal acquisition steps. Moreover, the first signal data set 21 as reference data set can be used to estimate the signal sparsity which is important in the CS setting to determine the number of samples that need to be acquired in the following steps. Furthermore, the fully sampled first signal data set 21 is used to determine several constraints used in the CS reconstruction of subsequent undersampled or low resolution second signal data sets. The reference information contained in the first signal data set 21 can be exploited in different ways for MR image reconstruction: In a very simple implementation, as depicted in FIG. 2, the first signal data set 21 is used to define a background data set 22 which is a binary mask in which the background image regions containing no image intensity are discriminated from the other image regions. Excluding the background pixels indicated in the background data set 22 in the following reconstruction steps decreases the number of unknowns. The conditioning of the reconstruction problem is improved in this way and imaging speed and MR image quality are enhanced. The first signal data set 21 as reference data set can also be used to estimate the signal support in a sparse transform domain for improving the CS reconstruction. In this way, a support for the CS reconstruction is derived from the first signal data set 21. Furthermore, the contrast information of the first signal data set 21 can be used as a constraint to reconstruct following undersampled second signal data sets with similar contrast. A second signal data set 23 is acquired by application of a second imaging sequence. The second signal data set 23 is of a different contrast type than the first signal data set. For example, the second imaging sequence used for acquisition of the second signal data set 23 is a $T_2$-weighted spin echo sequence. A MR image 24 is reconstructed from the undersampled second signal data set 23 by means of a CS regularization algorithm, wherein the first signal data set 21 (i.e. the above-mentioned information derived from the first signal data set 21) is used as prior information. In particular, the background mask 22 is used as a constraint in the CS reconstruction of the undersampled second signal data set 23.

In the embodiment shown in FIG. 3, a $T_1$-weighted first signal data set 21, a $T_2$-weighted second signal data set 23 and a FLAIR image as third signal data set 31 are acquired. The first, second, and third signal data sets 21, 23, and 31 are acquired with random undersampling. A signal support 32 is derived from the first, second, and third signal data sets 21, 23, and 31. The support 32 reflects the estimated signal support in the sparse transform domain of the CS setting. The signal support 32 is used as a constraint in the simultaneous CS reconstruction of MR images 24, 33, and 34. The MR images 24, 33, and 34 are of high quality and exhibit no undersampling artifacts.

As illustrated by the above embodiments of the invention, the exploitation of the redundant spatial and contrast information contained in the first, second (and third) signal data sets 21, 23 (and 33) can significantly accelerate routine clinical scanning while reducing the k-space sampling density. Patient throughput can be increased in this way and, hence, patient comfort and cost efficiency. Alternatively, the gain in examination time can be spent on additional functional MR examinations in order to improve the diagnostic value.

The invention claimed is:

1. Method of MR imaging of at least a portion of a body of a patient placed in an examination volume of a MR device, the method comprising the steps of:
   subjecting the portion of the body to a first imaging sequence for acquiring a first signal data set;
   subjecting the portion of the body to a second imaging sequence for acquiring a second signal data set, wherein the imaging parameters of the second imaging sequence differ from the imaging parameters of the first imaging sequence and wherein the first and/or second signal data sets are undersampled;
   reconstructing a MR image from the second signal data set by means of compressed sensing and wherein the compressed sensing reconstruction is constrained by a support, which support is derived from the first signal data set and wherein the imaging parameters of the second imaging sequence differ from the imaging parameters of the first imaging sequence in such a manner that the second signal data set is of a different contrast type or of a different resolution than the first signal data set.

2. Method of claim 1, wherein the first and second imaging sequences are selected from the group consisting of:
   $T_1$-weighted spin echo, $T_2$-weighted spin echo, fluid-attenuated inversion-recovery, $T_1$-weighted gradient-echo, $T_2^*$-weighted gradient echo, contrast enhanced $T_1$-weighted gradient echo, contrast enhanced $T_1$-weighted spin echo, diffusion-weighted spin echo.

3. Method of claim 1 wherein an image support in a sparse domain is identified from the first signal data set.

4. Method of claim 1, wherein non-Cartesian sampling of k-space is applied during acquisition of the first and/or second signal data sets.

5. Method of claim 1, wherein the first and/or second signal data sets are acquired by means of parallel imaging via two or more RF receiving antennas, wherein the MR image is reconstructed by taking the spatial sensitivity profiles of the RF receiving antennas into account.

6. Method of claim 1, wherein a variable density k-space sampling pattern of the second imaging sequence is determined from the first signal data set.

7. Method of claim 1, wherein background image regions containing no image intensity are determined from the first signal data set, and wherein the determined background image regions are used as a constraint in the reconstruction of the MR image.

8. Method of claim 1, further comprising image registration and/or motion correction of the first and second signal data sets before reconstruction of the MR image.

9. MR device for carrying out the method as claimed in claim 1, which MR device includes at least one main magnet coil for generating a uniform, steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit, wherein the MR device is arranged to perform the following steps:
  subjecting the portion of the body to a first imaging sequence comprising RF pulses and switched magnetic field gradients for acquiring a first signal data set;
  subjecting the portion of the body to a second imaging sequence comprising RF pulses and switched magnetic field gradients for acquiring a second signal data set, wherein the imaging parameters of the second imaging sequence differ from the imaging parameters of the first imaging sequence, wherein the first and/or second signal data sets are undersampled;
  reconstructing a MR image from the second signal data set by means of compressed sensing and wherein the compressed sensing reconstruction is constrained by a support, which support is derived from the first signal data set and wherein the imaging parameters of the second imaging sequence differ from the imaging parameters of the first imaging sequence in such a manner that the second signal data set is of a different contrast type or of a different resolution than the first signal data set.

10. Computer program to be run on a MR device, which computer program comprises instructions for:
  generating a first imaging sequence for acquiring a first signal data set;
  generating a second imaging sequence for acquiring a second signal data set, wherein the imaging parameters of the second imaging sequence differ from the imaging parameters of the first imaging sequence, and the first and/or second signal data sets are undersampled;
  reconstructing a MR image from the second signal data set, by means of compressed sensing and wherein the compressed sensing reconstruction is constrained by a support, which support is derived from the first signal data set and wherein the imaging parameters of the second imaging sequent differ from the imaging parameters of the first imaging sequence in such a manner that the second signal data set is of a different contrast type or of a different resolution than the first signal data set.

* * * * *